US011569381B2

(12) United States Patent
Pernot et al.

(10) Patent No.: US 11,569,381 B2
(45) Date of Patent: Jan. 31, 2023

(54) DIAMOND MIS TRANSISTOR

(71) Applicants: Centre National De La Recherche Scientifique, Paris (FR); Institut Polytechnique De Grenoble, Grenoble (FR); Universite Grenoble Alpes, Saint Martin d'Heres (FR)

(72) Inventors: Julien Pernot, Grenoble (FR); Nicolas Rouger, Toulouse (FR); David Eon, Saint Martin d'Heres (FR); Etienne Gheeraert, Coublevie (FR); Gauthier Chicot, Fontaine (FR); Toan Thanh Pham, Grenoble (FR); Florin Udrea, Cambridge (GB)

(73) Assignees: CENTRE NATIONAL DE LA RECHERCHE SCIENTIFIQUE, Paris (FR); INSTITUT POLYTECHNIQUE DE GRENOBLE, Grenoble (FR); UNIVERSITE GRENOBLE ALPES, Saint Martin D'Heres (FR)

( * ) Notice: Subject to any disclaimer, the term of this patent is extended or adjusted under 35 U.S.C. 154(b) by 0 days.

(21) Appl. No.: 16/630,905

(22) PCT Filed: Jul. 18, 2018

(86) PCT No.: PCT/EP2018/069510
§ 371 (c)(1),
(2) Date: Jan. 14, 2020

(87) PCT Pub. No.: WO2019/016268
PCT Pub. Date: Jan. 24, 2019

(65) Prior Publication Data
US 2020/0235240 A1 Jul. 23, 2020

(30) Foreign Application Priority Data
Jul. 19, 2017 (EP) .................................... 17305959

(51) Int. Cl.
*H01L 29/78* (2006.01)
*H01L 29/16* (2006.01)
*H01L 29/66* (2006.01)

(52) U.S. Cl.
CPC ...... *H01L 29/7838* (2013.01); *H01L 29/1602* (2013.01); *H01L 29/66045* (2013.01); *H01L 29/7831* (2013.01); *H01L 29/7851* (2013.01)

(58) Field of Classification Search
CPC ............. H01L 29/7838; H01L 29/1602; H01L 29/66045; H01L 29/7831; H01L 29/7851; H01L 29/7827; H01L 29/785
See application file for complete search history.

(56) References Cited

U.S. PATENT DOCUMENTS 5,854,496 A 12/1998 Ishikura
8,143,130 B1 3/2012 Huang
(Continued)

FOREIGN PATENT DOCUMENTS

DE 102013111375 A1 4/2014
EP 0827208 3/1998
(Continued)

OTHER PUBLICATIONS

Schneider H et al., "The diamond for power electronic devices", Power Electronics and Applications, 2005, XP010934057.
(Continued)

*Primary Examiner* — Wasiul Haider
(74) *Attorney, Agent, or Firm* — Zaretsky Group PC; Howard Zaretsky

(57) ABSTRACT

The invention relates to a deep depletion MIS transistor (100), comprising: a source region (S) and a drain region (D) made of doped semiconductor diamond of a first conductivity type; a channel region (C) made of doped semiconductor diamond of the first conductivity type, arranged
(Continued)

between the source region and the drain region; a drift region (DR) made of doped semiconductor diamond of the first conductivity type, arranged between the channel region and the drain region; and a conductive gate (111) arranged on the channel region and separated from the channel region by a dielectric layer (113).

16 Claims, 4 Drawing Sheets

(56) References Cited

U.S. PATENT DOCUMENTS

2005/0269660 A1 12/2005 Singh
2010/0032008 A1* 2/2010 Adekore ............. H01L 31/0687 136/255
2012/0175679 A1* 7/2012 Marino ................. H01L 29/407 257/194
2014/0103439 A1 4/2014 Weis
2016/0240654 A1* 8/2016 Ohtani ................ H01L 29/0634
2016/0351567 A1* 12/2016 Schmid ............... H01L 27/0207
2018/0351448 A1* 12/2018 Igarashi .............. H02M 3/1588
2018/0366568 A1* 12/2018 Huang ................ H01L 29/0843

FOREIGN PATENT DOCUMENTS

EP 0827208 A2 * 3/1998 ....... H01L 29/66045
EP 0827208 A2 * 3/1998
EP 1895579 3/2008
JP H10125932 A 5/1998
JP 2017050485 A 3/2017
WO 2012072646 6/2012
WO WO-2012072646 A1 * 6/2012 ......... H01L 29/7725
WO 2019016268 1/2019

OTHER PUBLICATIONS

International Search Report and Written Opinion dated Sep. 24, 2018 in connection with PCT/EP2018/069510.
Ludikhuize et al., A Review of RESURF Technology, IEEE, XP-000987828, 0-7803-6269, pp. 11-18, May 22-25, 2000, Toulouse, France.

* cited by examiner

DIAMOND MIS TRANSISTOR

FIELD

The present application relates to the field of electronic power components. It more particularly aims at a MIS (metal-insulator-semiconductor) transistor having a high breakdown voltage, capable of withstanding high operating temperatures.

BACKGROUND

Different architectures of MIS transistors capable of being used as switches in high-power applications have been provided in literature.

There however remains a need for a MIS transistor capable of withstanding with no damage a very high voltage in the off state, for example, a voltage in the range from 1,000 to 30,000 volts, and further capable of withstanding a high operating temperature, for example, higher than 175° C.

SUMMARY

Thus, an embodiment provides a deep depletion MIS transistor, comprising:

a source region and a drain region made of doped semiconductor diamond of a first conductivity type;

a channel region made of doped semiconductor diamond of the first conductivity type, arranged between the source region and the drain region;

a drift region made of doped semiconductor diamond of the first conductivity type, arranged between the channel region and the drain region; and a conductive gate arranged on the channel region and separated from the channel region by a dielectric layer.

According to an embodiment, the transistor comprises:

a first layer made of doped semiconductor diamond of the first conductivity type, having the source, drift and drain regions formed therein;

a source metallization electrically connected to the source region; and a drain metallization electrically connected to the drain region.

According to an embodiment, the source and drain metallizations are arranged on the side of a same surface of said first layer.

According to an embodiment, the channel region is formed in said first layer.

According to an embodiment, the thickness of the first layer at the level of the channel region is substantially the same as at the level of the source and drain regions.

According to an embodiment, the transistor has a planar structure.

According to an embodiment, the transistor comprises a semiconductor fin formed in the first layer, the conductive gate coating the upper surface and the lateral surfaces of a section of the fin.

According to an embodiment, the thickness of the first layer at the level of the channel region is smaller than at the level of the source and drain regions.

According to an embodiment, the channel region is formed in a second layer made of doped semiconductor diamond of the first conductivity type, having a doping level different than that of the first layer.

According to an embodiment, the transistor comprises an additional channel region made of doped semiconductor diamond of the first conductivity type, arranged between the channel region and the drain region, and an additional conductive gate arranged on the additional channel region and separated from the additional channel region by said dielectric layer.

According to an embodiment, the source and drain metallizations are arranged on the side of opposite surfaces of the first layer.

According to an embodiment, a third layer made of doped semiconductor diamond of the first conductivity type, having a heavier doping level than the first layer, forms an interface between the source and drain metallizations and the first layer.

According to an embodiment, the first layer rests on a substrate made of doped semiconductor diamond of the second conductivity type.

According to an embodiment, a fourth layer made of doped semiconductor diamond of the first conductivity type, having a different doping level than the first layer, forms an interface between the substrate and the first layer.

Another embodiment provides an assembly comprising a transistor as defined above, and a control circuit configured to:

apply to the transistor a first gate-source voltage higher than or equal to its threshold voltage to place the transistor in an off state; and apply to the transistor a second gate-source voltage lower than its threshold voltage to place the transistor in an on state.

BRIEF DESCRIPTION OF THE DRAWINGS

The foregoing and other features and advantages will be discussed in detail in the following non-limiting description of dedicated embodiments in connection with the accompanying drawings, among which.

DETAILED DESCRIPTION

Figure 1:
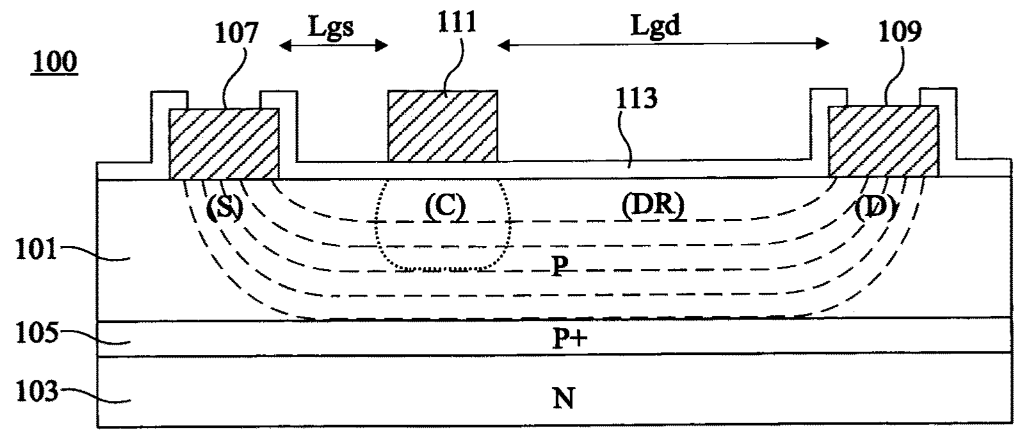
FIG. 1 is a cross-section view schematically illustrating an embodiment of a MIS power transistor.

The same elements have been designated with the same reference numerals in the various drawings and, further, the various drawings are not to scale. In the following description, when reference is made to terms qualifying absolute positions, such as terms “top”, “bottom”, “left”, “right”, etc., or relative positions, such as terms “above”, “under”, “upper”, “lower”, etc., or to terms qualifying directions, such as terms “horizontal”, “vertical”, etc., it is referred to the orientation of the drawings, it being understood that, in practice, the described structures may be oriented differently. Unless otherwise specified, expressions "approximately", "substantially", and "in the order of" mean to within 10%, preferably to within 5%.

According to an aspect of the described embodiments, a deep depletion MIS transistor where the channel region is made of doped diamond, preferably single-crystal diamond, is provided. Deep depletion MIS transistor means a MIS transistor which can be turned off (blocked) by creating a deep depletion in the channel region (that is, across the entire thickness thereof). In the on state, the depletion is reduced or cancelled, and drain-source conduction occurs within the volume of the channel region and of the drift region (as schematically illustrated by the dashed current lines on FIGS. 1 and 5), which provides a relatively low on-state resistance. The use of diamond as a semiconductor channel enables to obtain a very high off-state breakdown voltage, as well as a very high temperature operation capability (for example higher than 175° C. and possibly up to 450° C. or higher).

To place the transistor in the deep depletion state (off state), a voltage greater than or equal to the threshold voltage $V_T$ is applied to its gate. The threshold voltage $V_T$ is the voltage at which the inversion can theoretically occur, which can be defined as follows:

$$V_T = 2\psi_b + \frac{\sqrt{2\varepsilon_{SC} q N_A (2\psi_b)}}{\varepsilon_{ox}/t_{ox}}$$

with $t_{ox}$ and $\varepsilon_{ox}$ being the gate oxide thickness and permittivity, $\varepsilon_{sc}$ being the semiconductor permittivity, q being the elementary charge, $N_A$ being the doping level of the semiconductor, and $\psi_b$ being the potential difference between the intrinsic level and the fermi level in the neutral material defined as follows:

$$\psi_b=(kT/q)ln(N_A/n_i)$$

with $n_i$ being the intrinsic concentration of dopants in the semiconductor, T being the temperature, and k being the Boltzmann constant.

Due to the high bandgap of diamond, in the order of 5.5 eV, the quickest characteristics generation time constant of minority carrier is in the order of $10^{37}$ seconds, that is in the order of $10^{30}$ years. This means that, in practice, when a voltage greater than or equal to the threshold voltage $V_T$ is applied to the gate of the transistor the inversion never occurs (although it could theoretically occur). This makes it possible to use the deep depletion state to ensure the holding of the transistor in the off state. Such a deep depletion state cannot be used in semiconductor materials having lower bandgaps, due to the occurrence of an inversion state after a very short time, typically in the order of one second in silicon at room temperature. For this particular reason, deep depletion MIS transistors have never been used to date for high-power applications.

FIG. 1 is a cross-section view schematically illustrating an embodiment of a MIS power transistor 100.

Transistor 100 comprises a P-type doped single-crystal diamond semiconductor layer 101, for example, having a doping level in the range from $10^{15}$ to $10^{20}$ atoms/cm$^3$. Layer 101 is for example boron doped. The thickness of layer 101 is for example in the range from a few nanometers to a few micrometers, for example, from 10 nm to 20 μm, and preferably from 200 nm to 10 μm.

In this example, layer 101 rests on an N-type doped diamond substrate 103. Further, in this example, a P-type doped diamond buffer layer 105, having a doping level different than that of layer 101, preferably greater than that of layer 101, forms an interface between substrate 103 and layer 101. As an example, buffer layer 105 is formed by epitaxy on top of and in contact with the upper surface of substrate 103, layer 101 being itself formed by epitaxy on top of and in contact with the upper surface of buffer layer 105.

Transistor 100 further comprises:

- a source contact metallization 107 arranged on top of and in contact with the upper surface of layer 101, in the left-hand portion of the transistor;
- a drain contact metallization 109 arranged on top of and in contact with the upper surface of layer 101, in the right-hand portion of the transistor; and
- a conductive gate 111 arranged on the upper surface of layer 101, between source contact metallization 107 and drain contact metallization 109, insulated from layer 101 by a dielectric layer 113, for example, made of alumina.

The source (S) and drain (D) regions of transistor 100 correspond to portions of layer 101 respectively connected to metallization 107 and to metallization 109 and separated, in top view, by gate 111. The channel region (C) of transistor 100 corresponds to a portion of layer 101 located under gate 111, separating the source region from the drain region. In practice, although it does not appear on FIG. 1, the conductive gate 111 preferably has an annular shape which completely surrounds the drain region. This allows to increase the voltage blocking capability of the transistor and to limit the current leakage in the off state.

Figure 2:
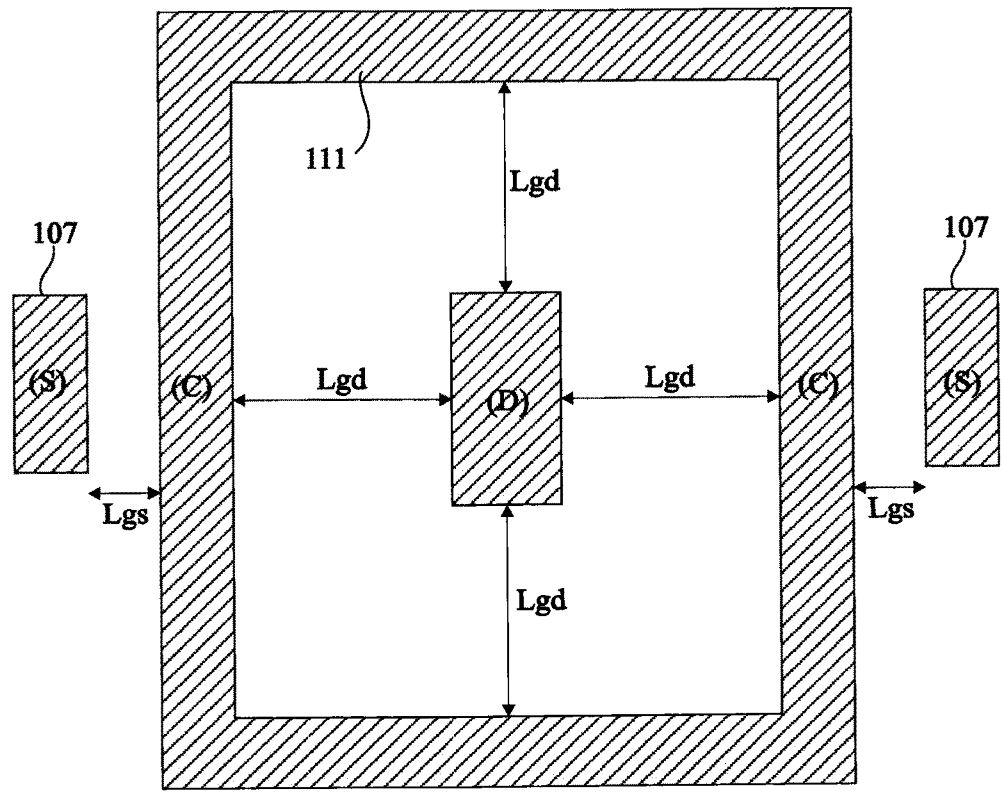
FIG. 2 is a top view schematically illustrating an embodiment of a MIS power transistor.

FIG. 2 is a top view of an example of a deep depletion diamond MIS transistor in which the conductive gate surrounds the drain region. For clarity purposes, only the metallization 107, 109 and 111 have been represented on FIG. 2.

In operation, source metallization 107 of transistor 100 is connected to a node of application of a high power supply potential, and drain metallization 109 of transistor 100 is connected to a node of application of a low power supply potential. For example, the high power supply potential can be 0 V, and the low power supply potential can be a negative potential, for example lower or equal to −1000 V. When the gate-source voltage of the transistor is lower than the threshold voltage $V_T$, the transistor is on and a current may flow between its source and its drain, by volume conduction in layer 101. When a gate-source voltage greater than or equal to the threshold voltage $V_T$, for example, in the range from 5 to 15 volts, is applied to the transistor, the holes, which are the majority carriers in layer 101, are pushed back (as illustrated by the dotted line on FIG. 1) all the way to the space charge region formed at the junction between P-type layers 101 and 105 on the one hand, and N-type substrate 103 on the other hand. The channel region is thus fully depleted across its entire thickness, and electrically insulates the source region from the drain region. The transistor then is in the off state. In this state, the transistor can withstand a very high source-drain voltage, typically higher than 1,000 V, having its maximum value especially depending on the doping level of layer 101 and on distance Ldg between gate 111 and drain metallization 109 of the transistor.

It should indeed be noted that in the off state, the gate-source voltage is relatively low, typically in the order of 5 to 15 volts (in absolute value), while the drain-gate voltage can be very high, typically in the order of 1000 V or higher (in absolute value). For example, in the off state, the source potential Vs is in the order of 0 V, the drain potential Vd is negative relatively to the source potential Vs, for example in the order of −1000 V or lower, and the gate potential is positive relatively to the source voltage, for example in the range from 5 to 15 V. As a consequence, the voltage blocking capability of the transistor is mainly defined by the characteristics of the region of layer 101 extending, in top view, from the drain metallization 109 to the conductive gate 111, called drift region (DR), and more particularly by the dimensions and doping level of the drift region. In the example of FIG. 1, distance Lgs between source metallization 107 and gate 111 is much smaller, for example, at least twice smaller than distance Lgd between gate 111 and drain metallization 109. This enables to gain surface area since the gate-source voltage is relatively low. As an example, the gate-source distance Lgs is lower than or equal to 1 μm and the gate-drain distance Lgd is greater than or equal to 2 μm, for example comprised in the range from 2 to 50 μm.

In this example, buffer layer 105 particularly has a charge compensation function, limiting the extension in layer 101 of the space charge area formed at the junction between P-type layers 101 and 105, and N-type substrate 103 on the other hand. This enables to ensure that the transistor remains sufficiently conductive in the on state. However, as a variation, buffer layer 105 may be omitted if the thickness and/or the dopant concentration of layer 101 are sufficiently high to avoid for the space charge area to extend across the entire thickness of the channel region.

Figure 3:
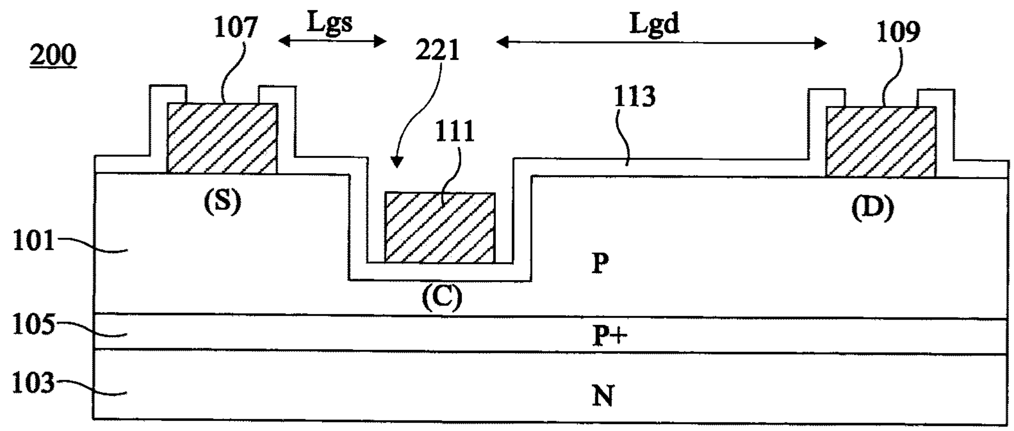
FIG. 3 is a cross-section view schematically illustrating another embodiment of a MIS power transistor.

FIG. 3 is a cross-section view schematically illustrating another embodiment of a MIS power transistor 200. Transistor 200 comprises elements common with transistor 100 of FIG. 1. In the following, only the differences between the two transistors will be detailed.

Transistor 200 differs from transistor 100 in that, at the level of its channel region (C), layer 101 has a smaller thickness than at its source (S) and drain (D) regions. More particularly, in the example of FIG. 2, layer 101 comprises, between the source (S) and drain (D) regions of the transistor, a cavity 221 extending vertically from its upper surface. Cavity 221 is non-through, that is, part of the thickness of layer 101 is kept under cavity 221. In top view, cavity 221 extends all along the length and all across the width of the transistor channel region (C). Cavity 221 is for example formed by etching. Dielectric layer 111 especially coats the bottom and the lateral walls of cavity 221. Gate 111 is arranged on the bottom of cavity 221, still insulated from layer 101 by dielectric layer 113.

An advantage of the structure of FIG. 2 is that it enables to decouple the drift region and the channel region of the transistor. Thus, a channel region which can be fully depleted by application of a relatively low gate-source voltage, for example, lower than 15 volts, can be obtained, while having a lightly resistive drift region (the region of layer 101 separating drain metallization 109 from gate 111). It also allows to have a thick drift region (for example comprised between 2 μm and 30 μm) while maintaining a low threshold voltage $V_T$ in the thin channel region.

It should be noted that in the example shown in FIG. 3, conductive gate 111 is in contact with the bottom of cavity 221, but not with the lateral walls of the cavity.

As a variation, conductive gate 111 may be in contact not only with the bottom but also with the lateral walls of cavity 221 (while remaining of course insulated from layer 101 by layer 113).

Further, in the example shown in FIG. 3, the lateral walls or sides of cavity 221 are substantially vertical, that is, orthogonal to layer 101. As a variation, the sides of cavity 221 may be inclined so that cavity 221 has a flared shape, that is, wider in its upper portion than in its lower portion.

Figure 4:
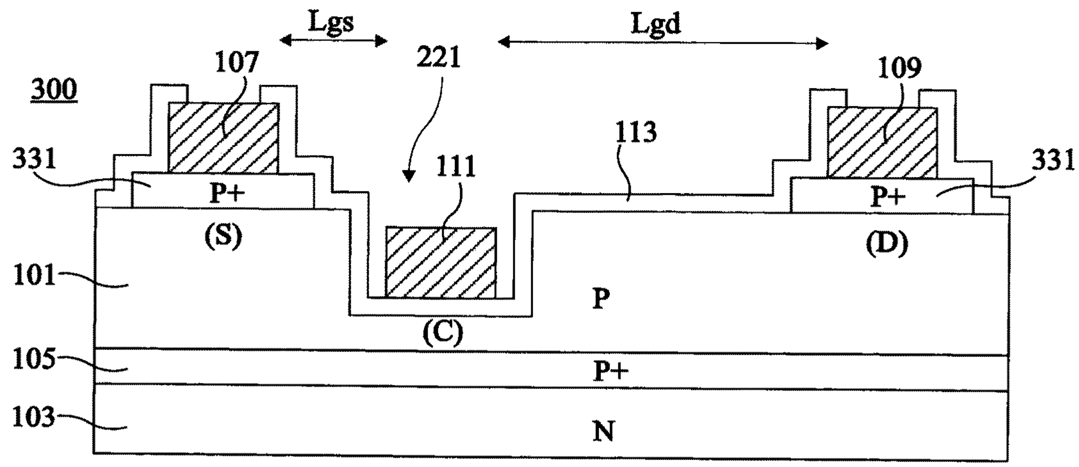
FIG. 4 is a cross-section view schematically illustrating another embodiment of a MIS power transistor.

FIG. 4 is a cross-section view schematically illustrating another embodiment of a MIS power transistor 300. Transistor 300 comprises elements common with transistor 200 of FIG. 3. In the following, only the differences between the two transistors will be detailed.

Transistor 300 differs from transistor 200 in that its source and drain contact metallizations 107 and 109 are not directly in contact with layer 101, but rest on a P-type doped single-crystal diamond layer 331, having a heavier doping level than layer 101. More particularly, in the shown example, layer 331 is arranged on top of and in contact with the upper surface of layer 101, and metallizations 107 and 109 are formed on top of and in contact with the upper surface of layer 331. Layer 331 is located at the level of the transistor source and drain contacting regions. In particular, layer 331 is not present at the level of the transistor channel region. As an example, layer 331 is formed by local epitaxy on top of and in contact with the upper surface of layer 101, at the level of the source and drain contacting regions. As a variation, layer 331 is first formed by epitaxy all over the upper surface of layer 101, and then locally removed by etching at the level of the transistor channel region.

An advantage of the structure of FIG. 4 is that the presence of layer 331 enables to decrease the on-state resistance of the transistor, while limiting the thickness of layer 101 necessary for the drift region. Furthermore, this allows to improve the electrical contact between layer 101 and contact metallizations 107 and 109.

Figure 5:
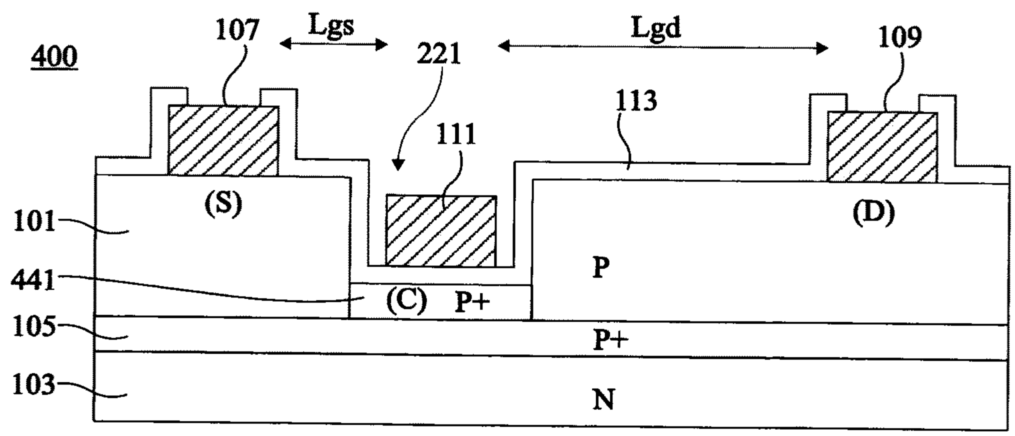
FIG. 5 is a cross-section view schematically illustrating another embodiment of a MIS power transistor.

FIG. 5 is a cross-section view schematically illustrating another embodiment of a MIS power transistor 400. Transistor 400 comprises elements common with transistor 200 of FIG. 3. In the following, only the differences between the two transistors will be detailed.

Transistor 400 differs from transistor 200 in that its channel region (C) has a heavier P-type doping level than its source (S) and drain (D) regions. To achieve this, it may be provided to remove layer 101 across its entire thickness during the etching of cavity 221, and then to grow by selective epitaxy, at the bottom of cavity 221, before the deposition of dielectric layer 113, a local layer 441 made of P-type doped single-crystal diamond, having a doping level different than that of layer 101, for example higher than that of layer 101. Layer 441 for example has a thickness smaller than that of layer 101.

An advantage of the structure of FIG. 5 is the greater flexibility of adjustment of the doping levels and of the thicknesses of the channel region (C) and of the source (S) and drain (D) regions of the transistor to ensure the voltage withstanding, while allowing a full depletion of the channel region in the off state, and while minimizing the on-state resistance and controlling the threshold voltage.

Figure 6:
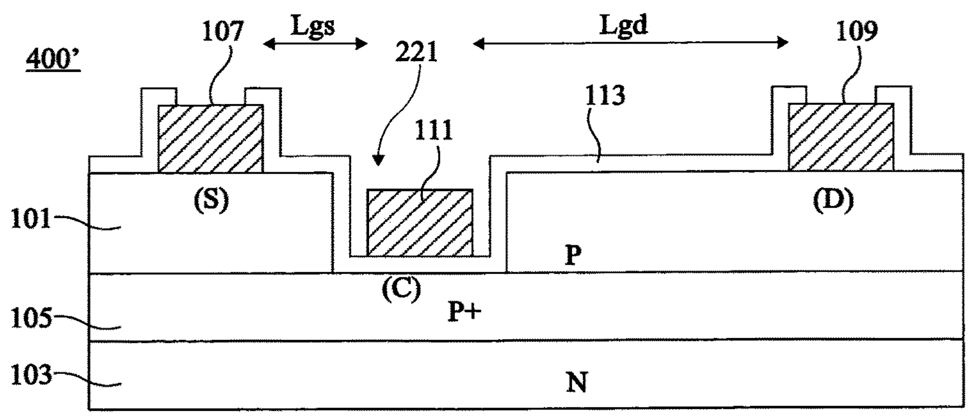
FIG. 6 is a cross-section view schematically illustrating another embodiment of a MIS power transistor.

FIG. 6 is a cross-section view schematically illustrating another embodiment of a MIS power transistor 400'. Transistor 400' comprises elements common with transistor 400 of FIG. 5. In the following, only the differences between the two transistors will be detailed.

Transistor 400' differs from transistor 400 in that its buffer layer 105 has a thickness higher than the thickness necessary for strictly compensating the charges of the N-type substrate 103. In other words, in transistor 400', the space charge region formed at the junction between layers 101 and 105 does not extend in an upper portion of layer 105.

In transistor 400', the channel region (C) is located in the upper portion of layer 105. To achieve this, it may be provided to remove layer 101 across its entire thickness during the etching of cavity 221, and then to deposit the insulating layer 113 and the conductive gate 111 directly on top of the upper surface of layer 105, at the bottom of cavity 221.

Figure 7:
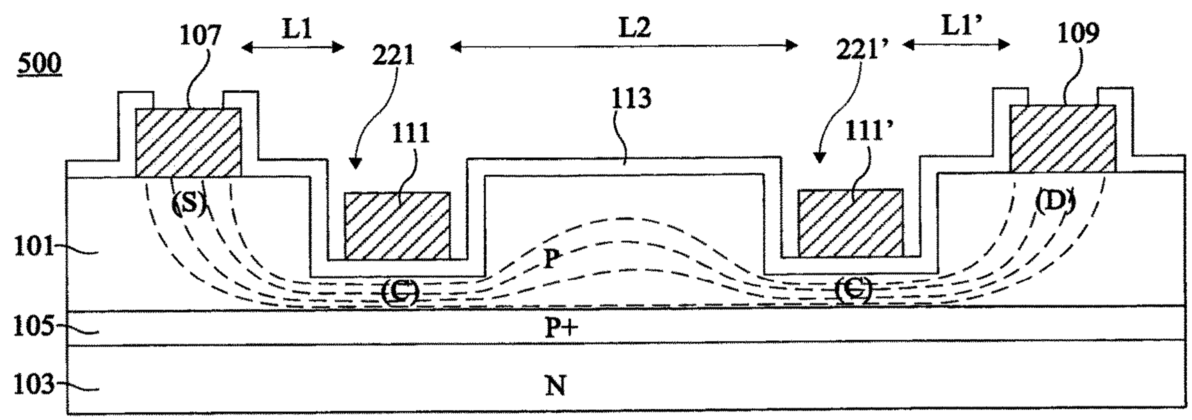
FIG. 7 is a cross-section view schematically illustrating another embodiment of a MIS power transistor.

FIG. 7 is a cross-section view schematically illustrating another embodiment of a MIS power transistor 500. Transistor 500 comprises elements common with transistor 200 of FIG. 3. In the following, only the differences between the two transistors will be detailed.

Transistor 500 differs from transistor 200 in that it comprises, between its channel region (C) and its drain region (D), a second channel region (C') topped with a second conductive gate 111'. Gate 111' is arranged in a cavity 221' different from cavity 221, separating, in top view, the channel region (C) from the drain region (D). Like gate 111, gate 111' is insulated from layer 101 by dielectric layer 113.

In this example, distance L1 separating source metallization 107 from gate 111 and distance L1' separating drain metallization 109 of gate 111' are relatively low. Distance L2 separating gate 111 from gate 111' is however relatively large, for example, at least twice large than distance L1. The region of layer 101 located between channel regions (C) and (C') defines the transistor drift region.

In operation, a high voltage (for example higher than or equal to 1000 V) can be applied between the source metallization 107 and the drain metallization 109. First and second low voltages (for example lower than 15 V in absolute value) can be applied respectively between the first conductive gate 111 and the source metallization 107, and between the second conductive gate 111' and the drain metallization 109, to control the on or of state of the channel regions (C) and (C') respectively.

An advantage of transistor 500 of FIG. 5 is that it is bidirectional for voltage and current.

Figure 8:
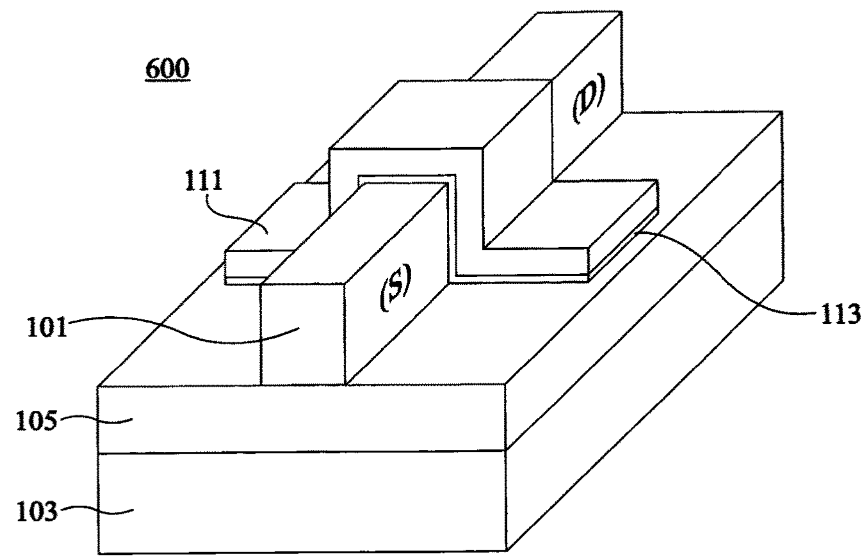
FIG. 8 is a cross-section view schematically illustrating another embodiment of a MIS power transistor.

FIG. 8 is a cross-section view schematically illustrating another embodiment of a MIS power transistor 600. Transistor 600 comprises elements common with transistor 100 of FIG. 1. In the following, only the differences between the two structures will be detailed.

Transistor 600 comprises a semiconductor fin formed in layer 101 and resting on layer 105 or, in the absence of layer 105, on substrate 103. The fin is delimited by trenches etched from the upper surface of layer 101 and extending in depth down to the upper surface of layer 105 in this example. Gate insulator 113 and conductive gate 111 coat the three free surfaces of at least a section of the fin, that is, its lateral surfaces and its upper surface. The fin section partially surrounded with gate 111 forms the channel region of the transistor. On either side of gate 111 are located portions of layer 101 respectively forming the source region (S) and a drain region (D) of the transistor. For simplification, the source and drain metallizations have not been shown in FIG. 6. As an example, the source and drain metallizations are arranged on top of and in contact with the upper surface of layer 101. An intermediate P type layer of diamond, having a higher doping level than layer 101 (not shown on FIG. 6), may be provided at the interface between the source and drain metallizations and layer 101.

Transistor 600 may be controlled similarly to what has been previously described. The transistor is turned off by the depleting of the fin across its entire thickness at the level of the channel region of the transistor.

The transistors described in relation with FIGS. 1 to 8 all have a lateral structure, that is, the current essentially flows laterally in layer 101, which enables to benefit from a very high breakdown voltage, typically greater than 1,000 V, despite a relatively small thickness of layer 101, for example, smaller than 10 μm.

According to the considered application, a deep depletion MIS power transistor having a vertical or pseudo-vertical structure, that is, where the current essentially vertically flows, may however be formed.

Figure 9:
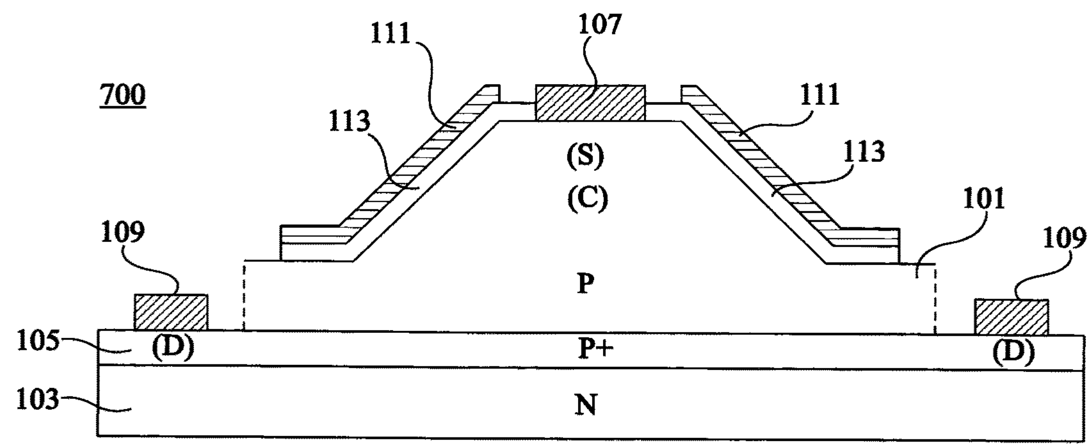
FIG. 9 is a cross-section view schematically illustrating another embodiment of a MIS power transistor.

FIG. 9 is a cross-section view schematically illustrating an embodiment of a MIS power transistor 700 having a pseudo-vertical structure. Transistor 700 comprises elements common with transistor 100 of FIG. 1. In the following, only the differences between the two structures will be detailed.

Figure 10:
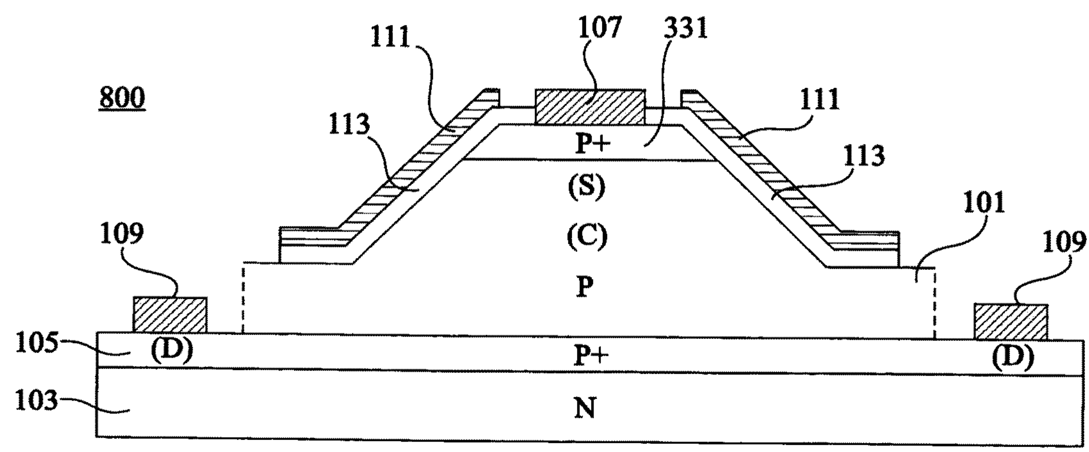
FIG. 10 is a cross-section view schematically illustrating another embodiment of a MIS power transistor.

Transistor 700 comprises a semiconductor island or mesa formed in layer 101 and resting on layer 105. The island is delimited by trenches etched from the upper surface of layer 101 and extending in depth down to the upper surface of layer 105. Source metallization 107 is arranged on top of and in contact with the upper surface of the island, while drain metallization 109 is arranged on top of and in contact with the upper surface of layer 105, at the periphery of the island. Conductive gate 111 is arranged on an upper part of the sides of the island formed in layer 101, and insulated from layer 103 by dielectric layer 113. One should note that the drawings of FIGS. 9 and 10 are not to scale. Indeed, in practice, the upper portion of layer 101, on the side of which the gate 111 extends, is much thinner than the lower portion of layer 101, whose sides are not covered by the gate 111. For example, the thickness of the lower portion of layer 101 is at least twice the thickness of the upper portion of layer 101. As an example, the thickness of the upper portion of layer 101 is lower than or equal to 1 μm and the thickness of the lower portion of layer 101 is comprised in the range from 2 to 50 μm. In the transistor of FIG. 7, the drift region correspond to the lower portion of layer 101.

FIG. 10 is a cross-section view schematically illustrating another embodiment of a MIS power transistor 800 having a pseudo-vertical structure. Transistor 800 differs from transistor 700 of FIG. 9 essentially in that it further comprises, as in the example of FIG. 3, an upper layer 331 made of P-type doped single-crystal diamond, having a heavier doping level than layer 101. The semiconductor island is formed in the stack of layers 331 and 101. Thus, source contact metallization 107 of the transistor is in contact with the upper surface of layer 331.

Specific embodiments have been described. Various alterations and modifications will occur to those skilled in the art. In particular, although only P-channel MIS transistor structures have been described, it will be within the abilities of those skilled in the art to adapt the described embodiments by inverting all conductivity types to obtain N-channel depletion MIS transistors.

Further, in the examples described in relation with FIGS. 1 to 10, N-type doped diamond substrate 103 may be replaced with a substrate of different nature, for example, an insulating substrate.

Further, it will be obvious to those skilled in the art that several elementary transistors of the type described above can be associated in series and/or in parallel to accumulate their voltage and current withstanding capabilities.

It should further be noted that those skilled in the art may combine various elements of the various described embodiments and variations without showing any inventive step. In particular, the alternative embodiments described in relation with FIGS. 1, 2, 3, 4, and 5 may be combined.

The invention claimed is:

1. A deep depletion metal-insulator-semiconductor (MIS) transistor, comprising:

a source region and a drain region made of doped semiconductor diamond of a first conductivity type;

a channel region made of doped semiconductor diamond of the first conductivity type, arranged between the source region and the drain region;

a drift region made of doped semiconductor diamond of the first conductivity type, arranged between the channel region and the drain region;

a conductive gate arranged on the channel region and separated from the channel region by a dielectric layer, wherein said conductive gate surrounds said drain region;

a source metallization electrically connected to the source region and a drain metallization electrically connected to the drain region, wherein a distance between the source metallization and the gate is smaller than a distance between the gate and drain metallization; and wherein the MIS transistor is adapted to be turned off by creating a depletion across an entire thickness of the channel region.

2. The transistor according to claim 1, comprising:

a first layer made of doped semiconductor diamond of the first conductivity type, having the source, drift and drain regions formed therein.

3. The transistor according to claim 2, wherein the source and drain metallizations are arranged on a surface side same as of said first layer.

4. The transistor according to claim 3, wherein the channel region is formed in said first layer.

5. The transistor according to claim 4, wherein a thickness of the first layer at a level of the channel region is substantially the same as at a level of the source and drain regions.

6. The transistor according to claim 5, having a planar structure.

7. The transistor according to claim 5, comprising a semiconductor fin formed in said first layer, the conductive gate coating an upper surface and lateral surfaces of a section of the fin.

8. The transistor according to claim 4, wherein a thickness of the first layer at a level of the channel region is smaller than at a level of the source and drain regions.

9. The transistor according to claim 3, wherein the channel region is formed in a second layer made of doped semiconductor diamond of the first conductivity type, having a doping level different than that of the first layer.

10. The transistor according to claim 3, comprising an additional channel region made of doped semiconductor diamond of the first conductivity type, arranged between the channel region and the drain region, and an additional conductive gate arranged on the additional channel region and separated from the additional channel region by said dielectric layer.

11. The transistor according to claim 2, wherein the source and drain metallizations are arranged on opposite surface sides of the first layer.

12. The transistor according to claim 2, wherein a third layer made of doped semiconductor diamond of the first conductivity type, having a heavier doping level than the first layer, forms an interface between the source and drain metallizations and the first layer.

13. The transistor according to claim 2, wherein the first layer rests on a substrate made of doped semiconductor diamond of the second conductivity type.

14. The transistor according to claim 13, wherein a fourth layer made of doped semiconductor diamond of the first conductivity type, having a different doping level than the first layer, forms an interface between the substrate and the first layer.

15. An assembly, comprising:

a deep depletion metal-insulator-semiconductor (MIS) transistor, including:

a source region and a drain region made of doped semiconductor diamond of a first conductivity type;

a channel region made of doped semiconductor diamond of the first conductivity type, arranged between the source region and the drain region;

a drift region made of doped semiconductor diamond of the first conductivity type, arranged between the channel region and the drain region;

a conductive gate arranged on the channel region and separated from the channel region by a dielectric layer, wherein said conductive gate surrounds said drain region;

a source metallization electrically connected to the source region and a drain metallization electrically connected to the drain region, wherein a distance between the source metallization and the gate is smaller than a distance between the gate and drain metallization;

a control circuit configured to:

apply to the MIS transistor a first gate-source voltage higher than or equal to its threshold voltage to place the MIS transistor in an off state; and apply to the MIS transistor a second gate-source voltage lower than its threshold voltage to place the MIS transistor in an on state.

16. A deep depletion metal-insulator-semiconductor (MIS) transistor, comprising:

a source region and a drain region made of doped semiconductor diamond of a first conductivity type;

a channel region made of doped semiconductor diamond of the first conductivity type, arranged between the source region and the drain region;

a drift region made of doped semiconductor diamond of the first conductivity type, arranged between the channel region and the drain region;

a conductive gate arranged on the channel region and separated from the channel region by a dielectric layer, wherein said conductive gate has an annular shape which completely surrounds said drain region;

a source metallization electrically connected to the source region and a drain metallization electrically connected to the drain region, wherein a distance between the source metallization and the gate is smaller than a distance between the gate and drain metallization; and wherein the MIS transistor is adapted to be turned off by creating a depletion across an entire thickness of the channel region.

* * * * *